United States Patent [19]

Defranould et al.

[11] Patent Number: 4,821,004

[45] Date of Patent: Apr. 11, 1989

[54] METHOD FOR THE ELIMINATION OF SPURIOUS ECHOS IN ELECTRO-ACOUSTIC DELAY LINES USING BULK WAVES AND DELAY LINE APPLYING THIS METHOD

[75] Inventors: Philippe Defranould, Le Rouret; Marc Verroust, Cagnes Sur Mer, both of France

[73] Assignee: Thomson-CSF, Paris, France

[21] Appl. No.: 133,048

[22] PCT Filed: Mar. 6, 1987

[86] PCT No.: PCT/FR87/00058

§ 371 Date: Jan. 14, 1988

§ 102(e) Date: Jan. 14, 1988

[87] PCT Pub. No.: WO87/06073

PCT Pub. Date: Oct. 8, 1987

[30] Foreign Application Priority Data

Mar. 25, 1986 [FR] France .................................. 86 04284

[51] Int. Cl.⁴ .............................................. H03H 9/36
[52] U.S. Cl. .................................... 333/143; 333/145; 333/149; 333/187
[58] Field of Search ........ 333/141, 142, 143, 186–187, 333/149, 144, 145, 147, 148; 310/326–328, 335

[56] References Cited

U.S. PATENT DOCUMENTS

| | | | |
|---|---|---|---|
| 3,582,834 | 6/1971 | Evans | 333/142 |
| 3,735,292 | 5/1973 | Probst | 333/142 |
| 3,996,535 | 12/1976 | Turski | 333/142 |

FOREIGN PATENT DOCUMENTS

| | | | |
|---|---|---|---|
| 1940982 | 2/1968 | Fed. Rep. of Germany | |
| 46-24978 | 7/1971 | Japan | 333/143 |
| 177458 | 11/1966 | U.S.S.R. | |
| 8706073 | 10/1987 | World Int. Prop. O. | |
| 8706074 | 10/1987 | World Int. Prop. O. | |

Primary Examiner—Marvin L. Nussbaum
Attorney, Agent, or Firm—Oblon, Fisher, Spivak, McClelland & Maier

[57] ABSTRACT

Methods are disclosed for the elimination of spurious echos in electro-acoustic delay lines using bulk waves. The method consists in etching an array, formed of hollows and peaks on a reflecting side of a delay line of this type, the difference in height between the said hollows and peaks giving the waves reflected from them a phase difference such that the signals induced by the spurious echos in the transducer cancel one another out. The method can be used to improve the characteristics of a delay line using bulk waves without excessively complicating its manufacture.

8 Claims, 2 Drawing Sheets

FIG_1
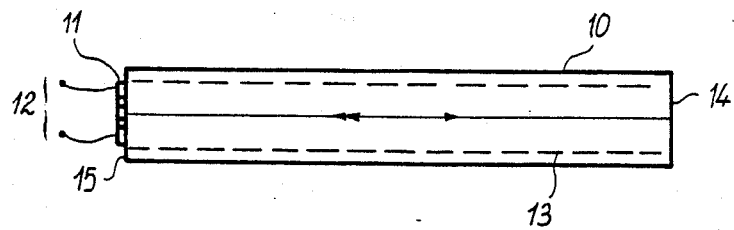
FIG_2
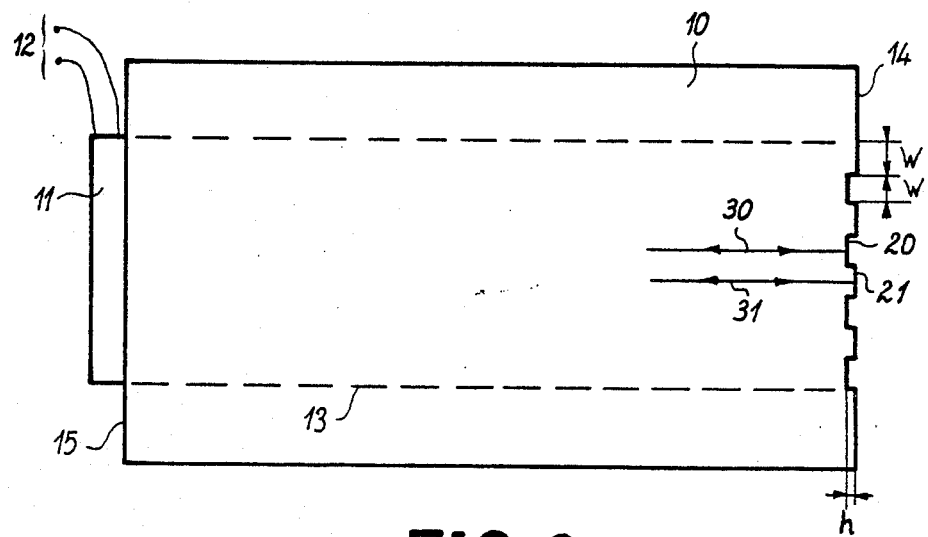
FIG_3
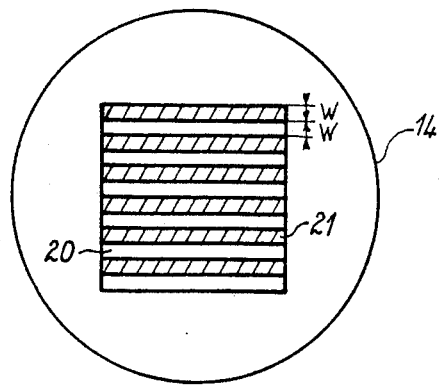

FIG_4
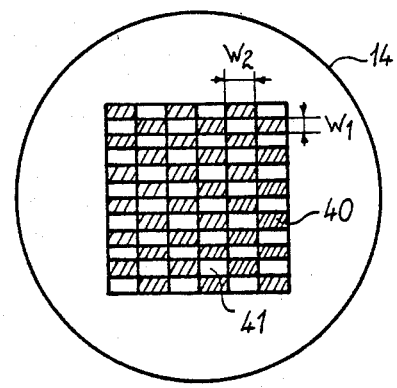
FIG_5
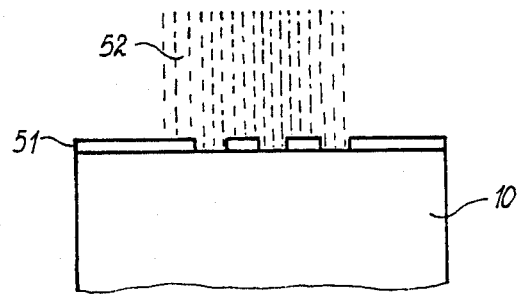

METHOD FOR THE ELIMINATION OF SPURIOUS ECHOS IN ELECTRO-ACOUSTIC DELAY LINES USING BULK WAVES AND DELAY LINE APPLYING THIS METHOD

BACKGROUND OF THE INVENTION

1. Field of the Invention

The present invention pertains to methods used to eliminate or, at least, to greatly attentuate spurious echos which occur in electro-acoustic delay lines that use bulk waves.

2. Description of the Prior Art

Prior art methods for delaying electrical signals include the use of an electro-acoustic delay line in which the electrical signals are first converted into sonic or ultra-sonic sound signals. These signals are propagated in the line at a speed which is far smaller than that of light, thus giving substantial delays in a small volume. After undergoing the desired delay, the acoustic signals are then reconverted into electrical signals.

This kind of electro-acoustic delay line of the reflection type, for example, is shown in FIG. 1. It comprises a propagation medium 10 made of corundum for example. This medium generally takes the form of a cylinder-shaped elongated rod for example. An electro-acoustic transducer 11 formed of a thin film of piezoelectric material fitted with metallic electrodes joined to connections 12 is applied to the terminal side 15 of this rod. Under the effect of an electrical signal applied to these connections, this transducer excites a sound wave in the rod and this sound wave is propagated to the other terminal side 14 of the rod along an acoustic beam 13 with a section which is substantially constant and equal to the area of the transducer. This sound wave is reflected on the surface 14 and returns to the surface 15 where it excites the transducer 11 to give, at the connections 12, an electrical signal similar to the initial signal barring the attenuation due to the transmission. A line of this type is, of course, unusable for delaying pulses which are distinct from one another since the input transducer also acts as an output transducer. Hence, a pulse of this type is delayed by a duration $t=2L/v$ where L is the length of the rod between its sides 15 and 14 and v is the speed of the sound waves in the medium 10.

However, it is not possible to make the transducer perfectly adapted to the propagating medium, and a portion of the acoustic energy received by this transducer is again reflected so that it sets off again towards the side 14. It is reflected in turn from this side 14 and returns to the transducer and excites it, producing a spurious echo which has a delay t with respect to the main signal formed by the useful echo.

The amplitude of this spurious echo, known as a double-path echo or a double-transit echo must be reduced to the minimum.

The same problem arises in transmission lines comprising two transducers where, for example, one is a transmitting transducer on the side 15 and the other a receiving transducer on the side 14. These transmission lines are used essentially to delay the continuous signals for which the transmitter must be properly separated from the receiver. In this case, the spurious echo is the one that returns to the side 14 after being reflected successively from this side 14 and the side 15. This is a triple-path or triple-transit echo.

One prior art method for eliminating these echos is to slightly tilt the terminal sides of the rod 10 with respect to the axis of propagation. For the useful path, the acoustic beam is just slightly offset with respect to the axis of the rod, but for the spurious path the acoustic beam no longer encounters the receiving transducer and preferably reaches the wall of the rod at a place where an absorbent product is fixed. A technique of this type is described, for example, by CROFUT in MICROWAVE JOURNAL 1967, Vol. 10, pp 65 to 72.

Prior art methods as described in the French patents Nos. 2.522.452 and 2.523.784 also include the making of electric acoustic delay lines with at least one terminal side having a concave shape by which the sound waves can be focused to reduce losses. In these delay lines, the sound waves move to and fro several times to obtain substantial delays of several tens of microseconds for example, and the spurious echos are reduced by a geometrical arrangement and by respective positions of the transducers and the focusing terminal sides which make it possible to divert the spurious echos.

These various methods are difficult to apply and complicate the manufacturing of a device which has to be simple and sturdy.

3. Summary of the Invention

According to the invention, to eliminate the spurious echos, path differences are created in the acoustic beam to provoke phase shifts such that the spurious echo is destroyed by interference as far as double transit echos and, as the case may be, triple transit echos are concerned.

For this, the acoustic beam sub-divided into a set of beams having the required path difference by making a topographical array on at least one of the surfaces which encounter the beam, the said array being made on the elements from which the beams are reflected with distinct delays.

Although the phase opposition is absolutely perfect for only one frequency, the attenuation of the spurious echos is still substantial in a band of about 20% to 30% around this optimum frequency.

BRIEF DESCRIPTION OF THE DRAWINGS

Other special features and advantages of the invention will appear clearly from the following description made with reference to the appended figures, of which:

FIG. 1 is a sectional view of a delay line of the prior art;

FIG. 2 is a sectional view of a delay line in which the invention is applied;

FIGS. 3 and 4 are two alternatives of the reflecting array of the side 14 of FIG. 2;

FIG. 5 illustrates a machining method to obtain the arrays of FIGS. 3 and 4.

DESCRIPTION OF A PREFERRED EMBODIMENT

FIG. 2 shows a delay line of the reflecting type with a single transducer, similar to the delay line shown in FIG. 1 but one in which the invention is applied.

For this, an array shown in FIG. 3 has been etched on the side 14 on which the waves are reflected, the said array comprising parallel lines which form a succession of hollows 20 and peaks 21 with a constant width W. The section of these hollows and peaks is rectangular, and the depths of the hollows with respect to the peaks is equal to $\lambda/8$ where $\lambda$ is the wavelength of the sound waves propagated through the delay line for the central operating frequency f of the said delay line. This frequency is generally the resonance frequency of the transducer 11.

Furthermore, the width W is great with respect to the wavelength λ, namely it is equal to at least several tens of λ, and the dimensions of the array are sufficient for the acoustic beam not to go beyond this array where it is reflected on the side 14.

In view of these sizes, the beams 30 and 31 which are respectively reflected from the hollows and the peaks of the array are not diffracted, because of the width W, and set off in a direction parallel to the incident direction with a difference equal to twice the depth h of the hollows with respect to the peaks. Thus, for the first echo which forms the useful signal, this path difference is equal to λ/4, and for the second echo which forms the spurious signal, this same path difference λ/4 is added to the one obtained during the first reflection. The total path difference for this second echo is then equal to λ/2.

When the second echo excites the transducer 11, the beams coming from the reflection from the hollows thus induce electrical voltages in this transducer which are in phase opposition with the voltages induced by the beams reflected from the peaks. Since the sub-divided beams of the beam 13 are distributed equally among the hollows and the peaks, as they have the same length, the electrical signals induced in phase opposition have the same amplitude and thus cancel each other out.

Strictly speaking, this cancellation is perfect only for the frequency f, but the attenuation is high in a range of frequencies of about 20% to 30% around f, a level that is generally adequate, especially when the duration of the pulse is substantially greater than the period 1/f. Furthermore, this duration D should be small compared with the delay of the line so that there are no stationary waves. These two conditions are generally fulfilled in standard uses of this type of delay line.

The arrangement of the array shown in FIG. 3 is only an example of an embodiment. In particular, these sub-divided beams may be inclined in any way and the array may cover the entire surface 14.

In fact, the essential condition of the array is that the total areas of the hollows and the peaks should be equal, that the smallest area of a hollow or peak should be great when compared with the sound wavelength and that their number should be sufficient to distribute small and inevitable unevennesses and therefore, to even out the effect of these unevennesses.

In particular, this array can be made in the form of a mosaic pattern as shown in FIG. 4, comprising hollow rectangles 40 and rectangles in relief 41, with a width W2 and a height W1, juxtaposed so that a hollow rectangle is contiguous with four rectangles in relief and vice-versa.

To make an array of this type, various manufacturing methods are possible.

For example, as shown in FIG. 5, ionic etching can be used. For this, the surface of the rod 10 to be etched, which is made of corundum for example, is covered with a mask 51, made of chromium for example, having openings at the places where it is sought to obtain the hollows of the array. These openings are obtained by the conventional method of photoetching. Under the effect of a beam of ions 52, for example argon ions, an erosion is obtained both of the rod through the openings of the mask and of the mask itself. Since the selectivity of the machining process, namely the difference in erosion speed between the chromium and the corundum, is fairly small, the mask is of the consumable type and therefore has an initial thickness adequate to take any operation without vanishing.

For a frequency f equal to 4.3 GHz, the depth of the furrows should be equal to 0.33 microns and, in this case, a 0.6 micron thick mask is used. The etching operation itself then takes about 10 minutes.

It is worthwhile to perform this etching operation on a large-sized corundum block from which several individual delay lines are then cut out. An alternative method is to assemble several lines, already cut out, in a suitable tool which holds the surfaces on which the arrays are to be etched in one and the same plane.

Instead of etching an array of this type, it is also possible to manufacture the said array by attaching it to the side 14, for example, by evaporating a material which constitutes the array by extra thickness. This material will be chosen so that its acoustic impedance is substantially equal to that of the medium, to prevent reflections at the interface between the medium and the material. It is possible, for example, to use chromium on a curundum medium.

In one embodiment, for a cylindrical delay line made of curundum, with a length of 56 mm. and a diameter of 10 mm., giving a delay of 10 microseconds for a signal with a central frequency of 4.3 GHz, an array was made with a depth h=0.33 microns and a width W of 100 microns, giving a relative attenuation of 20 decibels in the echo, in a pass-band of 10% around the central frequency.

This method extends to the case of a transmission line in which a receiving transducer is placed on the terminal side 14. In this case, the array is made (although with greater difficulty) on the side bearing the transducer, and the depth h should be equal to λ/6.

What is claimed is:

1. A method for the elimination of spurious echos in electro-acoustic delay lines having at least two sides using bulk waves, in which a spurious acoustic beam is propagated in a sound medium from one of said sides, said one side having only one transducer and is reflected on at least the other of said sides of this medium, and wherein this other side is prepared so as to divide this beam into two parts of the same intensity, having a difference in path such that the electrical signals induced in an output transducer by these parts cancel each other out; wherein these two parts are formed of two sets of beams, and wherein this side is prepared so that it presents an array formed of a set of a plurality of hollows having linear dimensions and a set of a plurality of peaks having linear dimensions corresponding respectively to the two sets of beams, the total area of the hollow being equal to the total area of the peaks, the linear dimensions of the hollows and peaks being greater than the acoustic wavelength of the waves of the beam so that there is no diffraction, the difference in the height between the hollows and the peaks determining the said path difference.

2. A method according to the claim 1 wherein the hollows and the peaks are in the form of parallel lines.

3. A method according to claim 2 wherein the dimensions of the sets of hollows and peaks are at least equal to those of the acoustic beam.

4. A method according to claim 2 wherein the sets of hollows and peaks are obtained by the ionic etching of the side (14) through a chromium mask (51) deposited on a medium (10) made of corundum.

5. A method according to claim 2 wherein the sets of hollows and peaks are obtained by adding, to the side (14), a layer having the form of peaks.

6. A method according to the claim 1 wherein the hollows and the peaks are in the form of juxtaposed rectangles.

7. An electro-acoustic delay line using bulk waves to apply the method according to claim 1, the said line comprising a rod-shaped acoustic medium (10) having two two terminal sides (14, 15) that are plane and parallel and a transducer (11) on one of the sides (15) to transmit and receive a parallel acoustic beam (13) which has a central frequency f corresponding to a wavelength λ towards the other side (14), from which it is reflected towards the first side so as to excite the transducer, wherein this other side (14) has a set of hollows and a set of peaks, the difference in the height of which is equal to λ/8.

8. An electro-acoustic delay line using bulk waves to apply the method according to claim 1, the said line comprising a rod-shaped acoustic medium (10) having two terminal sides (14, 15) that are plane and parallel, a transducer (11) on one of the sides (15) to transmit a parallel acoustic beam (13), having a central frequency f corresponding to a wavelength λ, towards the other side to excite a second transducer placed on this other side (14), wherein this other side (14) has a set of hollows and a set of peaks, the difference in the height of which is equal to λ/6.

* * * * *